United States Patent
Hu et al.

(10) Patent No.: US 7,325,223 B2
(45) Date of Patent: Jan. 29, 2008

(54) MODIFICATION OF PIXELATED PHOTOLITHOGRAPHY MASKS BASED ON ELECTRIC FIELDS

(75) Inventors: Bin Hu, Portland, OR (US); Vivek Singh, Portland, OR (US); Victor P. Bashurin, Sarov (RU); Yuri D. Bogunenko, Sarov (RU)

(73) Assignee: Intel Corporation, Santa Clara, CA (US)

(*) Notice: Subject to any disclaimer, the term of this patent is extended or adjusted under 35 U.S.C. 154(b) by 254 days.

(21) Appl. No.: 11/096,613

(22) Filed: Mar. 31, 2005

(65) Prior Publication Data
US 2006/0225024 A1   Oct. 5, 2006

(51) Int. Cl.
*G06F 17/50* (2006.01)
(52) U.S. Cl. ............... 716/19; 716/20; 716/21
(58) Field of Classification Search ........... 716/21, 716/20, 19
See application file for complete search history.

(56) References Cited

U.S. PATENT DOCUMENTS 7,234,130 B2 *  6/2007  Word et al. ................. 716/21
2003/0103189 A1 *  6/2003  Neureuther et al. ......... 351/176
2004/0122636 A1 *  6/2004  Adam ............................ 703/2
2005/0216181 A1 *  9/2005  Estkowski et al. .......... 701/200
2005/0283747 A1 * 12/2005  Adam ............................ 716/4
2006/0040187 A1 *  2/2006  Troost et al. .................. 430/5

OTHER PUBLICATIONS

Robert J. Socha, And Andrew R. Neureuther "Models for Characterizing Phase-Shift Defect in Optical Projection Printing" IEEE Transaction On Semiconductor Manufacturing, vol. 8, No. 2, May 1995 pp. 139-149.*

* cited by examiner

*Primary Examiner*—Paul Dinh
*Assistant Examiner*—Nha Nguyen
(74) *Attorney, Agent, or Firm*—Blakely, Sokoloff, Taylor & Zafman LLP

(57) ABSTRACT

Faster synthesis of photolithography mask modifications is described. In one embodiment, the invention includes synthesizing a first binary photolithography mask, developing perturbations to an estimated electric field generated by the first mask in use, and synthesizing a second binary photolithography mask by applying the perturbations to the first mask.

19 Claims, 3 Drawing Sheets ly. The computations required to design the diffractive mask may be complex. For a 193 nm light source, each pixel may be about 100 nm across. For a 4 cm square mask, there may be billions of pixels. If, for example, the features on the wafer are illuminated by diffraction, each pixel may be either a transparent spot on the mask (1), an opaque spot on the mask (0), or a transparent spot that reverses the phase of the light passing through (−1). The use of three different values (+1, 0, −1) allows for greater control over the diffractive effects through the mask. However, with billions of pixels, it further increases the complexity.

MODIFICATION OF PIXELATED PHOTOLITHOGRAPHY MASKS BASED ON ELECTRIC FIELDS

BACKGROUND

1. Field

The present description relates to microelectronic photolithography and, in particular, to determining aerial images for photolithography masks that are modified.

2. Background

In the production of microelectronic and micro-machine devices, such as memory, processors, and controllers, photolithography is used. In photolithography, a photoresist layer is applied to a semiconductor wafer or other substrate. The photoresist is exposed through a mask. The mask exposes or shields different portions of the wafer from light, or some other element. The exposed photoresist is then processed with etching, deposition and other processes to produce the features of the various components, such as circuits and structures, in the wafer that make up the finished product.

The masks are designed using computer design programs that derive an aerial view or image of the wafer based on the electronic circuitry that is to be built on the wafer. The mask is designed to produce this aerial image on the wafer in the particular photolithography equipment that is to be used. In other words the mask must be designed so that when a particular wavelength of light at a particular distance is directed to a wafer through a particular set of optics and the mask, the desired pattern will be illuminated with the desired intensity on the wafer.

The computations required to design the diffractive mask may be complex. For a 193 nm light source, each pixel may be about 100 nm across. For a 4 cm square mask, there may be billions of pixels. If, for example, the features on the wafer are illuminated by diffraction, each pixel may be either a transparent spot on the mask (1), an opaque spot on the mask (0), or a transparent spot that reverses the phase of the light passing through (−1). The use of three different values (+1, 0, −1) allows for greater control over the diffractive effects through the mask. However, with billions of pixels, it further increases the complexity.

Much of the time required for a computer to design a mask is spent evaluating the aerial image that the mask will produce on the wafer and generating a set of pixels that will produce the desired aerial view in the intended photolithography chamber. With complex circuits, the computing time required to design a mask can have a significant impact on the development time for a particular new microelectronic device.

Whenever a circuit element is modified and whenever the design of the mask is improved or optimized, the mask must be recomputed. For a typical optimization process in which the pattern produced by a prototype mask is improved to produce a more accurate pattern, the mask must be recomputed several times to complete the optimization. Each mask computation may require several days to recompute the billions of pixels used for complex circuits. If there are several iterations, then several weeks may be added to a development cycle.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION

Some embodiments of the present invention use a pixelated mask that has already been synthesized and then synthesize the new mask based on perturbations from the earlier synthesized mask. This may reduce the time required to synthesize the new mask by a factor of ten or more. The computation of the new mask is simpler than synthesizing a new mask without using the prior mask and may be adapted to changes in imaging methodology and technology.

Figure 1:
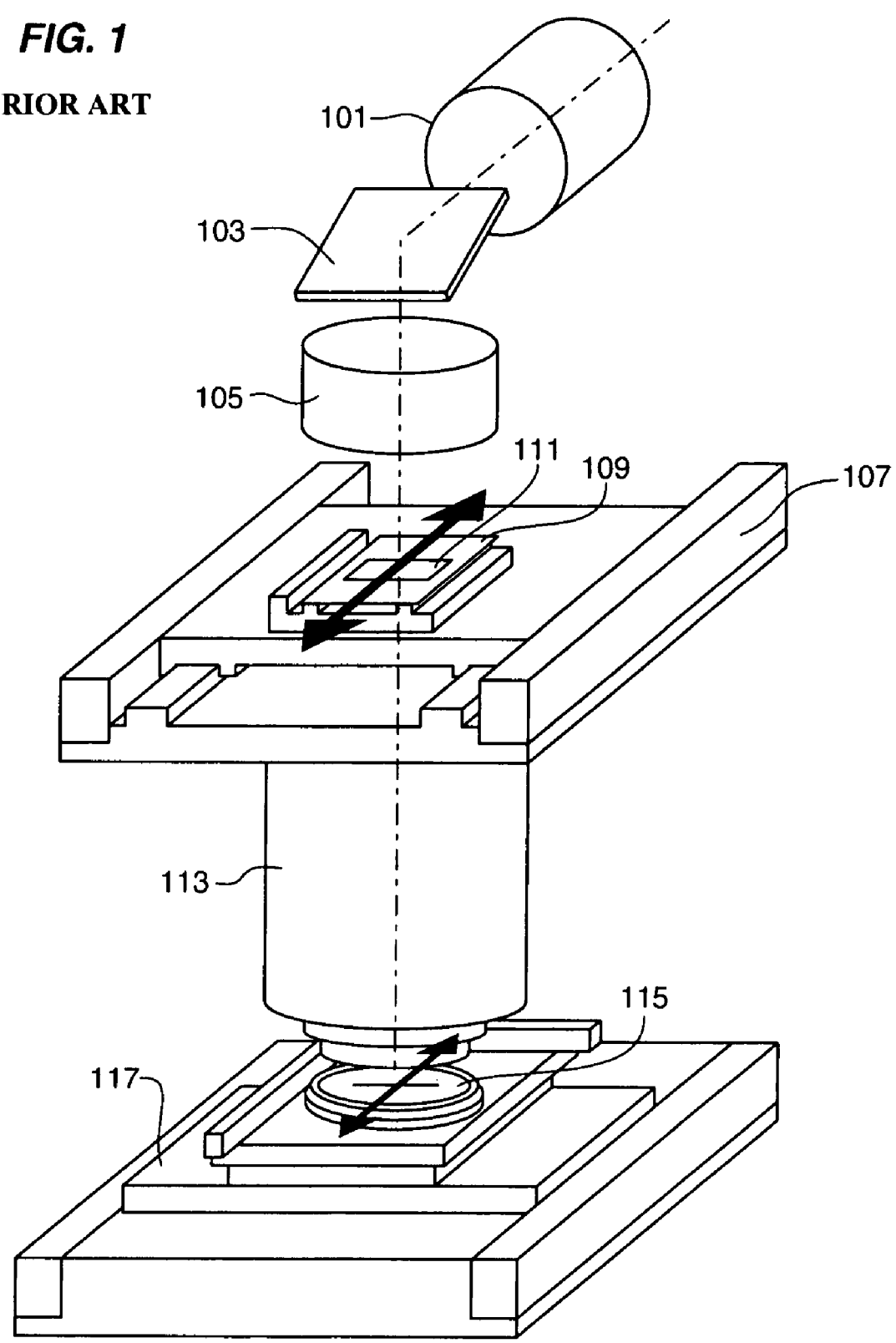
FIG. 1 is a diagram of a microelectronic fabrication device suitable for application to the present invention.

FIG. 1 shows a conventional microelectronic fabrication machine, in this case, a lens-scanning ArF Excimer Laser Stepper. The stepper may be enclosed in a sealed vacuum chamber (not shown) in which the pressure, temperature and environment may be precisely controlled. The stepper has an illumination system including a light source 101, such as an ArF excimer laser, a scanning mirror 103, and a lens system 105 to focus the laser light on the wafer. A reticle scanning stage 107 carries a reticle 109 which holds the mask 111. The light from the laser is transmitted onto the mask and the light transmitted through the mask is focused further by a projection lens with, for example, a four fold reduction of the mask pattern onto the wafer 115.

The wafer is mounted to a wafer scanning stage 117. The reticle scanning stage and the wafer scanning stage are synchronized to move the reticle and the wafer together across the field of view of the laser. In one example, the reticle and wafer move across the laser light in a thin line, then the laser steps down and the reticle and wafer move across the laser in another thin line until the entire surface of the reticle and wafer have been exposed to the laser. Such a step and repeat scanning system allows a high intensity narrow beam light source to illuminate the entire surface of the wafer. The stepper is controlled by a station controller (not shown) which may control the starting, stopping and speed of the stepper as well as the temperature, pressure and chemical makeup of the ambient environment, among other factors. The stepper of FIG. 1 is an example of a fabrication device that may benefit from embodiments of the present invention. Embodiments of the invention may also be applied to many other photolithography systems.

The mask controls the size of each feature on the wafer. The mask design is made up of chrome metal lines or lines of some other material of different widths and shapes designed to create a particular pattern on the wafer. When OPC (Optical Proximity Correction) is applied to the mask, the mask is modified iteratively, primarily by modifying the widths of the metal lines and adding decorations to corners, until the photolithography model predicts that the final wafer will match the intended target design. These iterations require significant computational resources and for complex designs may take days to complete.

According to the present invention, the computational time and the required resources may be greatly reduced. In one embodiment of the invention, the electric field around an isolated pixel of the new pixelated mask is pre-computed. This may be done by convolving the pixel with kernel functions. The kernel functions are derived based on the photolithography equipment with which the mask will be used. The kernel function may take into consideration the nature of the light source, any lenses or filters between the light source and the mask, the type of mask that is to be used, the geometry of the chamber and physical characteristics of the wafer that will be processed, as well as many other factors.

In one embodiment of the invention, the pre-computed electric field values are all normalized to a unit transmission value. As a result, when a pixel value is changed from one state in an old mask to a second state in a new mask, the normalized new value may be added to the old value to obtain the actual new value. If the new values are all pre-computed as normalized values and stored in a look-up table, then changes may be calculated for a new mask very quickly.

The pixelated mask may be constructed from a quartz plate with transparent or opaque chrome pixels. The pixels may be in rows and columns. Each pixel is an area on the quartz plate which is roughly square. The pixels may be either transparent (+1, −1), so light passes through or opaque (0) so that the light is blocked. The transparent areas may either reverse the phase of the light as it passes through (−1) or leave the phase of the light unaffected (+1). The pixelated mask can therefore be represented as a matrix of rows and columns with each position in the matrix having a value of +1, 0, or −1.

This matrix is convolved with the kernel function to determine the electric field at all of the positions on the wafer that are caused by exposure to light through the mask. The electric field is of interest because the electric field strength squared gives the intensity. The intensity is directly related to the effect on the photoresist that is being exposed through the mask. If the intensity exceeds a certain threshold value then the resist will be exposed sufficiently to be etched away in the next process.

Such a process may be represented by Eq. 1, in which E represents a matrix of electric field strength values across rows and columns of the wafer when it is exposed to the light source. P is the matrix of pixel values of the mask (+1, 0, −1) and K is a matrix of kernel functions. The cross operator is a matrix convolution.

$$E = PK \qquad \text{Eq.1}$$

The convolution of Equation 1 provides the value of the electric field that will be caused by the light at each pixel location on the wafer. The determination of the values of matrix E will be referred to herein as the pre-computation and the resultant values of the matrix E may be stored in a look-up table.

Each pixel will influence the electric field of the pixels around it. This influence decreases with distance from the pixel and at some distance, known as the ambit of a pixel, the influence may be ignored. The exact distance will depend on the particular light source, wafer and photoresist and may be the same across the entire wafer for any one particular process.

When the cumulative effect of the next distant set of pixels cannot change the electric field enough to push it below or above the threshold, then the electric field contribution of that set of pixels may be ignored. It has been found that for a common silicon wafer, with pixels that are centered 100 nm apart, and that is exposed with 193 nm light, the ambit may be about 4000 nm, i.e. any pixels 40 pixels away may be ignored. However a higher or lower value may be assigned and different applications will have different values for the ambit. For other wafer materials and other photoresist materials as well as other colors of light, the value for the ambit may be different.

Because the radius of the optical influence for the electric field induced by any one pixel is limited, a pre-computation for any one pixel may be performed using only pixels within this limited radius (ambit). The resulting electric fields may also be stored in a look-up table for use later.

The total actual electric field from an assembly of, for example rows and columns of, pixels may be computed using the E values stored in the look-up table. This computation may be expressed in the form of Equation 2, in which E(r) is a matrix of the actual total electric field on the wafer taking into consideration the contributions of all of the neighboring pixels within the ambit (radius of influence) of the pixel in question. This is an actual aerial image. The vectors $e_i(r_j)$ may be the actual electric field at local evaluation point r due to the i-th pixel as described further with respect to Equation 3. In Equation 2, i varies across all rows and columns to make the complete matrix of values. The matrix of values may be expressed as a matrix in one, two or more dimensions. For purposes of simplifying the present description, only one value, i, is used.

$$E(r_j) = \sum_i e_i(r_j) \qquad \text{Eq. 2}$$

As mentioned above, the electric field value $e_i(r_j)$ is a function of the relative location of the evaluation point r and the center of the i-th pixel. The contributions of electric fields for the pixels up to the ambit away on all sides of r may added together to determine the strength of the electric field at location r. The electric field $e_i(r)$ may be calculated as a multiplication of the pixel transmission value $p_i$ with the corresponding theoretical electric field value from the pre-computation look-up table, determined using, for example Eq.1. The pixel transmission value $p_i$ may take several discrete values, e.g., −1, 0, 1. The choice for p will depend upon the physical characteristics of the mask, and the mask manufacturing process.

This is expressed in Equation 3, in which $e_i(r_j)$ is the electric field at location r attributed to the i-th pixel, $p_i$ is the pixel transmission value for the i-th pixel, and $e_{i\text{-}j}$ is the electric field stored in the look-up table, as a function of the location r away from the center of the i-th pixel.

$$e_i(r_j) = P_i e_{i\text{-}j} \qquad \text{Eq.3}$$

When a new pixelated mask is to be synthesized due to mask optimization or circuit modifications, only a few of the pixels will change states in any one modification. As a result, the electric field generated by a new mask may be calculated as the summation of the original electric field for the pixel plus the perturbations or changes in the electric field that results from the changed pixels. Such a computation is reflected in Equation 4, in which $E_{new}(r)$ is a matrix representing an aerial image of all of the electric fields for the new mask, $E_{old}(r)$ is the corresponding matrix of electric fields for the old mask. $\Delta E(r)$ represents all of the normalized values within the matrix E(r) that have been changed in the new mask. The E(r) values may be applied directly to the summation because they have been normalized.

$$E_{new}(r) = E_{old}(r) + \Delta E(r) \qquad \text{Eq.4}$$

Using a process, such as that suggested by Equation 4, an aerial image may be computed using look-up searches and simple addition operations. In many cases, such an aerial image computation may be performed in one tenth the time required for an otherwise numerically intensive convolution operation as reflected in Equation 1. For those pixels that are not affected by the change, the old values may be used.

From the electric field values, the values may be compared to the photoresist threshold to determine the pattern that will be created on the wafer. This aerial image may be compared with the pattern that is desired. The electric field values may be iterated, if the resulting wafer pattern is not what was intended. Similarly, the pixel values for the mask may be iterated to ensure that the mask creates the desired pattern.

In one embodiment of the invention, a matrix of desired electric field values may be determined from the intended aerial image. the pixelated mask may be modified to more closely achieve the intended matrix of electric fields. The actual electric fields that would result from the candidate mask may be calculated using e.g. Eq. 4 and compared to the desired pattern. Appropriate changes may be made to the mask and another candidate mask may be tested by Eq. 4. Through such an iterative process, an optimized mask may be obtained.

Figure 2:
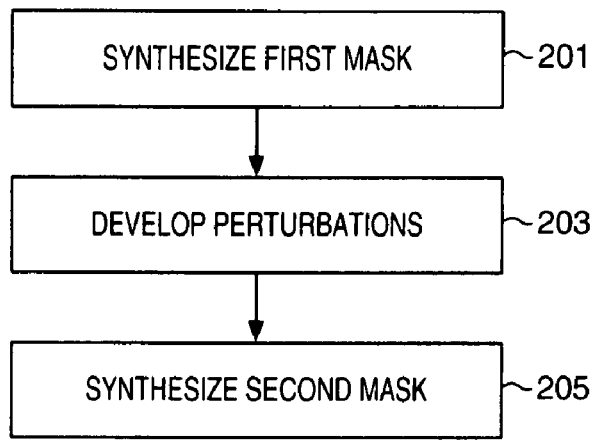
FIG. 2 is a process flow diagram of a modifying a mask according to an embodiment of the present invention.

FIG. 2 shows an example of such a process in the form of a process flow diagram. FIG. 2 shows synthesizing a first binary photolithography mask at block 201, This may be done, for example, by computing electric field values for pixel values of the first mask. Developing perturbations to an estimated electric field generated by the first mask is shown in block 203. Synthesizing a second binary photolithography mask is shown in block 205. The second binary mask may be synthesized by applying the perturbations to the first synthesized binary mask by, for example, adding electric field values of the perturbations to the computed first mask electric field values.

Figure 3:
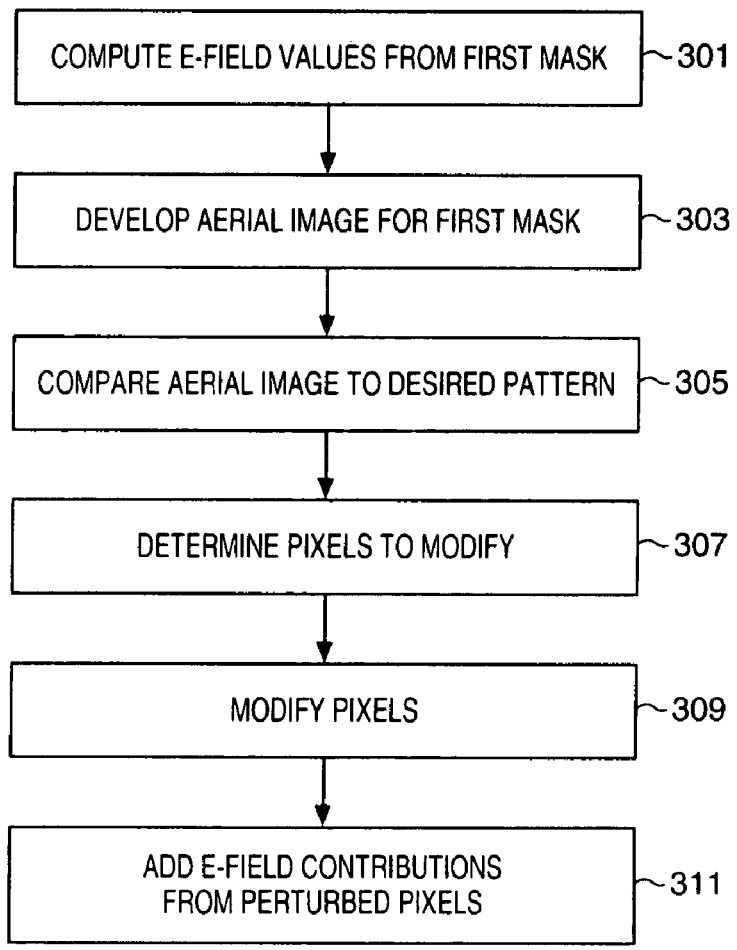
FIG. 3 is a process flow diagram of a modifying perturbed pixels of a mask according to an embodiment of the present invention.

FIG. 3 shows further details of developing perturbations as a process flow according to an embodiment of the invention. In FIG. 3, developing the perturbations begins at block 301 with computed electric field values from the first synthesized mask. At block 303, these electric field values may used to develop an aerial image of the pattern that would be created by the first mask. This pattern is compared to the desired pattern at block 305.

At block 307, the differences between the first mask aerial image and the desired pattern may used to select pixels in the first mask pattern that should be modified. At block 309, these selected pixels may modified. For the phase shift masks described above, the modification will change the pixel value from one of the three permitted values (-1, 0, 1) to another of the permitted values.

At block 311, the pixel electric field values may be modified by adding electric field contributions from pixels where perturbations may be present. The electric field contributions, as described above may be determined by taking electric field values from the first synthesized mask, then adding them by the value in the look-up table corresponding to the distance from the respective pixel to the pixel for which the perturbation is present. For most of the pixels, the factor may be zero and the contribution may be ignored. In other words, contributions are added only for pixels that are within some distance e.g. within the ambit of the pixel being adjusted.

The perturbations may be applied only to the pixels that are changed by the perturbations. At block 311, the other pixel values for the second mask will be the same as the values for the first mask. The resulting first mask pixels and perturbation pixels may be used to generate the second mask and an aerial image of the second mask. These processes may then be applied iteratively until the second mask reaches the desired accuracy.

Figure 4:
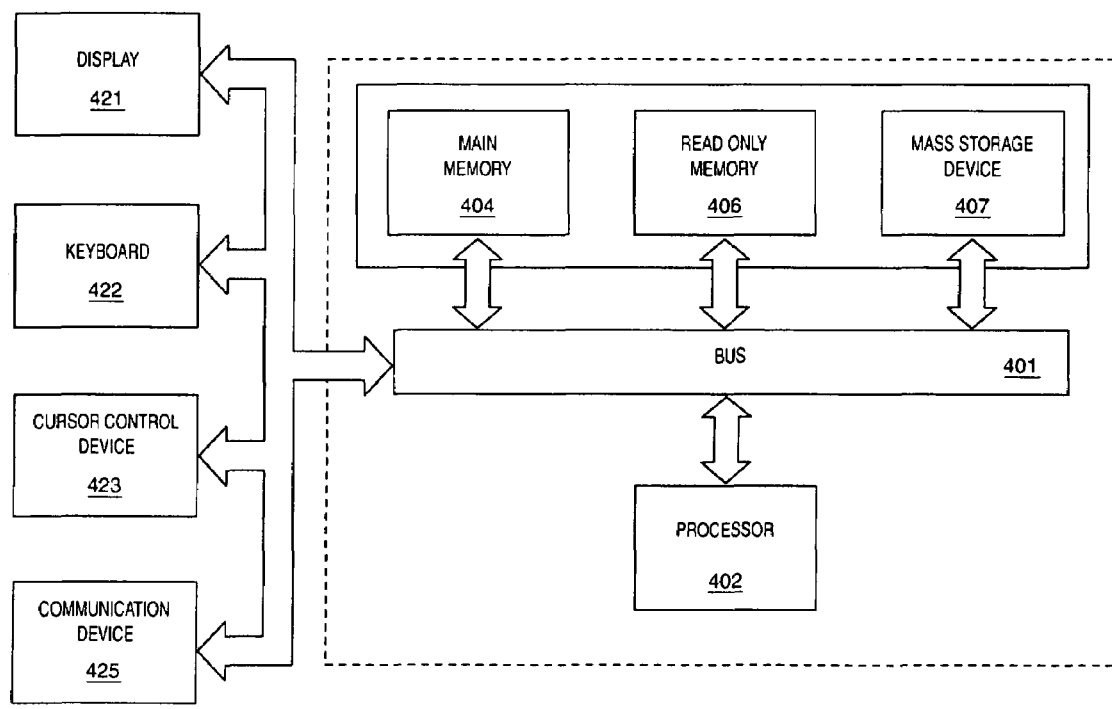
FIG. 4 is an example of a computer system capable of performing aspects of the present invention.

A computer system 400 representing an example of a system upon which features of the present invention may be implemented is shown in FIG. 4. The computer system 400 includes a bus or other communication means 401 for communicating information, and a processing means such as a microprocessor 402 coupled with the bus 401 for processing information. The computer system 400 further includes a main memory 404, such as a random access memory (RAM) or other dynamic data storage device, coupled to the bus 401 for storing information and instructions to be executed by the processor 402. The main memory also may be used for storing temporary variables or other intermediate information during execution of instructions by the processor.

The computer system may also include a nonvolatile memory 406, such as a read only memory (ROM) or other static data storage device coupled to the bus for storing static information and instructions for the processor. A mass memory 407 such as a magnetic disk or optical disc and its corresponding drive may also be coupled to the bus of the computer system for storing information and instructions.

The computer system can also be coupled via the bus to a display device or monitor 421, such as a cathode ray tube (CRT) or Liquid Crystal Display (LCD), for displaying information to a user. For example, graphical and textual indications of installation status, operations status and other information may be presented to the user on the display device. Typically, an alphanumeric input device 422, such as a keyboard with alphanumeric, function and other keys, may be coupled to the bus for communicating information and command selections to the processor. A cursor control input device 423, such as a mouse, a trackball, or cursor direction keys can be coupled to the bus for communicating direction information and command selections to the processor and to control cursor movement on the display 421.

A communication device 425 is also coupled to the bus 401. The communication device 425 may include a modem, a network interface card, or other well known interface devices, such as those used for coupling to Ethernet, token ring, or other types of physical attachment for purposes of providing a communication link to support a local or wide area network (LAN or WAN), for example. In this manner, the computer system may also be coupled to a number of clients or servers via a conventional network infrastructure, including an intranet or the Internet, for example.

It is to be appreciated that a lesser or more equipped computer system than the example described above may be preferred for certain implementations. Therefore, the configuration of the exemplary computer system 400 will vary from implementation to implementation depending upon numerous factors, such as price constraints, performance requirements, technological improvements, or other circumstances.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

It is to be appreciated that a lesser or more complex aerial image, electric field value determination, comparison process and new mask determination may be used than those shown and described herein. Therefore, the configurations may vary from implementation to implementation depending upon numerous factors, such as price constraints, performance requirements, technological improvements, or other circumstances. Embodiments of the invention may also be applied to other types of photolithography systems that use different materials and devices than those shown and described herein.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
    synthesizing a first binary photolithography mask;
    estimating an electric field that would be produced at pixel locations on a wafer by the synthesized mask in use;
    developing perturbations to the estimated electric field generated by the first mask in use at the pixel locations by comparing a desired pattern to a pattern estimated to be created on a microelectronic wafer by an aerial image generated from the first mask, calculating the effect of the electric field at other pixel locations within the ambit of each pixel location, and then modifying pixel values of the first mask based on the comparison and calculations to generate the perturbations;
    adding the contributions of the other pixel locations to the electric field at each pixel location; and
    synthesizing a second binary photolithography mask by applying the added contributions from the perturbations to the first mask.

2. The method of claim 1, the method further comprising normalizing the estimated first mask electric field values to a unit transmission value and normalizing the perturbations to a unit transmission value and wherein adding the contributions comprises adding the estimated electric field values to the normalized first mask electric field values.

3. The method of claim 1, wherein developing perturbations comprises adding electric field contributions for each pixel for which a perturbation is calculated.

4. The method of claim 1, wherein the ambit comprises the pixels that are changed by the perturbations.

5. The method of claim 1, further comprising storing the perturbations in a look-up table, and wherein synthesizing the second mask comprises performing searches of the look-up table and adding values from the look-up table to values of the first mask.

6. The method of claim 1, further comprising calculating an aerial image for the second mask using the aerial image of the first mask and the perturbations.

7. The method of claim 1, further comprising iteratively developing perturbations and synthesizing the second mask.

8. An article comprising a machine-readable medium comprising instructions, that when executed by the machine cause the machine to perform operations comprising:
    synthesizing a first binary photolithography mask;
    estimating an electric field that would be produced at pixel locations on a wafer by the synthesized mask in use;
    developing perturbations to the estimated electric field generated by the first mask in use at the pixel locations by comparing a desired pattern to a pattern estimated to be created on a microelectronic wafer by an aerial image generated from the first mask, calculating the effect of the electric field at other pixel locations within the ambit of each pixel location, and then modifying pixel values of the first mask based on the comparison and calculations to generate the perturbations;
    adding the contributions of the other pixel locations to the electric field at each pixel location; and
    synthesizing a second binary photolithography mask by applying the added contributions from the perturbations to the first mask.

9. The article of claim 8, the medium further comprising instructions causing the machine to perform further operations comprising normalizing the estimated first mask electric field values to a unit transmission value and normalizing the perturbations to a unit transmission value and wherein adding the contributions comprises adding the estimated electric field values to the normalized first mask electric field values.

10. The article of claim 8, wherein developing perturbations comprises adding electric field contributions for each pixel for which a perturbation is calculated.

11. The article of claim 8, wherein the ambit comprises the pixels that are changed by the perturbations.

12. A microelectronic device having a layer formed by photolithography using a mask, the mask being synthesized by:
    synthesizing a first binary photolithography mask;
    estimating an electric field that would be produced at pixel locations on a wafer by the synthesized mask in use;
    developing perturbations to the estimated electric field generated by the first mask in use at the pixel locations by comparing a desired pattern to a pattern estimated to be created on a microelectronic wafer by an aerial image generated from the first mask, calculating the effect of the electric field at other pixel locations within the ambit of each pixel location, and then modifying pixel values of the first mask based on the comparison and calculations to generate the perturbations;
    adding the contributions of the other pixel locations to the electric field at each pixel location; and
    synthesizing a second binary photolithography mask by applying the added contributions from the perturbations to the first mask.

13. The device of claim 12, wherein developing perturbations comprises adding electric field contributions for each pixel for which a perturbation is calculated.

14. The device of claim 13, wherein adding electric field contributions comprises adding electric field contributions only to the pixels that are changed by the perturbations.

15. The device of claim 14, further comprising storing the perturbations in a look-up table, and wherein adding electric field contributions comprises performing searches of the look-up table and adding values from the look-up table to values of the first mask.

16. An apparatus comprising:
a memory;
a bus coupled to the memory; and
a microprocessor coupled to the bus, the microprocessor having a layer formed by photolithography using a mask, the mask being synthesized by:
synthesizing a first binary photolithography mask;
estimating an electric field that would be produced at pixel locations on a wafer by the synthesized mask in use;
developing perturbations to the estimated electric field generated by the first mask in use at the pixel locations by comparing a desired pattern to a pattern estimated to be created on a microelectronic wafer by an aerial image generated from the first mask, calculating the effect of the electric field at other pixel locations within the ambit of each pixel location, and then modifying pixel values of the first mask based on the comparison and calculations to generate the perturbations;
adding the contributions of the other pixel locations to the electric field at each pixel location; and
synthesizing a second binary photolithography mask by applying the added contributions from the perturbations to the first mask.

17. The apparatus of claim 16, wherein developing perturbations further comprising normalizing the estimated first mask electric field values to a unit transmission value and normalizing the perturbations to a unit transmission value and wherein adding the contributions comprises adding the estimated electric field values to the normalized first mask electric field values.

18. The apparatus of claim 16, wherein developing perturbations comprises adding electric field contributions for each pixel for which a perturbation is calculated.

19. The apparatus of claim 16, wherein the ambit comprises the pixels that are changed by the perturbations.

* * * * *